(12) United States Patent
Ishimura et al.

(10) Patent No.: US 6,781,200 B2
(45) Date of Patent: Aug. 24, 2004

(54) INSULATED GATE SEMICONDUCTOR DEVICE FOR REALIZING LOW GATE CAPACITY AND A LOW SHORT-CIRCUIT CURRENT

(75) Inventors: Youichi Ishimura, Tokyo (JP); Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,026

(22) Filed: Jul. 30, 2002

(65) Prior Publication Data

US 2003/0141542 A1 Jul. 31, 2003

(30) Foreign Application Priority Data

Jan. 31, 2002 (JP) ........................................ 2002-023666

(51) Int. Cl.$^7$ .......................... H01L 29/76; H01L 29/94; H01L 31/062; H01L 31/113; H01L 31/119
(52) U.S. Cl. ........................ 257/330; 257/329; 257/331; 257/341; 257/342
(58) Field of Search ................................. 257/329, 330, 257/331, 341, 342

(56) References Cited

U.S. PATENT DOCUMENTS 6,040,599 A * 3/2000 Takahashi .................... 257/330
6,392,272 B1 * 5/2002 Hasegawa .................... 257/329

FOREIGN PATENT DOCUMENTS

JP          2001-94104      4/2001

* cited by examiner

*Primary Examiner*—Steven Loke
(74) *Attorney, Agent, or Firm*—Oblon, Spivak, McClelland, Maier & Neustadt, P.C.

(57) ABSTRACT

In an insulated gate semiconductor device having first, second and third gate electrodes (10) which are buried in first, second, and third trenches (7), an emitter electrode (11) is commonly connected to a base region (4), an emitter region (5) and the second gate electrode (10b), and the third gate electrode (10c) is connected to only the first gate electrode (10a). An insulating interlayer (9) interposed between the emitter electrode (11) and the gate electrodes (10) has a pattern configuration such that the second gate electrode is partially connected to the emitter electrode, to thereby control a gate capacity and suppress a short-circuit current caused by a crack.

8 Claims, 12 Drawing Sheets

INSULATED GATE SEMICONDUCTOR DEVICE FOR REALIZING LOW GATE CAPACITY AND A LOW SHORT-CIRCUIT CURRENT

BACKGROUND OF THE INVENTION

1. Field of the Invention

The present invention relates to an insulated gate semiconductor device and, more particularly, to an improvement of an insulated gate bipolar transistor and a power MOSFET having an insulated gate, which realizes a low gate capacity and a low short-circuit current at a low resistance, and to a method of manufacturing the insulated gate bipolar transistor.

2. Description of the Prior Art

In general power electronics for driving a motor and the like, power semiconductor elements of, for example, an insulated gate bipolar transistor (to be referred to as "IGBT" hereinafter) are mainly used as switching elements because of their characteristics in a region having a rated voltage of 300 V or more. Of these power semiconductor elements, there attract increasing attentions to an insulated gate semiconductor device having a trench gate, i.e., an insulated gate semiconductor device having a structure in which a gate electrode is buried in a trench formed in one major surface of a semiconductor substrate because of the following advantages. That is, the insulated gate semiconductor device can be easily micropatterned and integrated at a high density.

Figure 6:
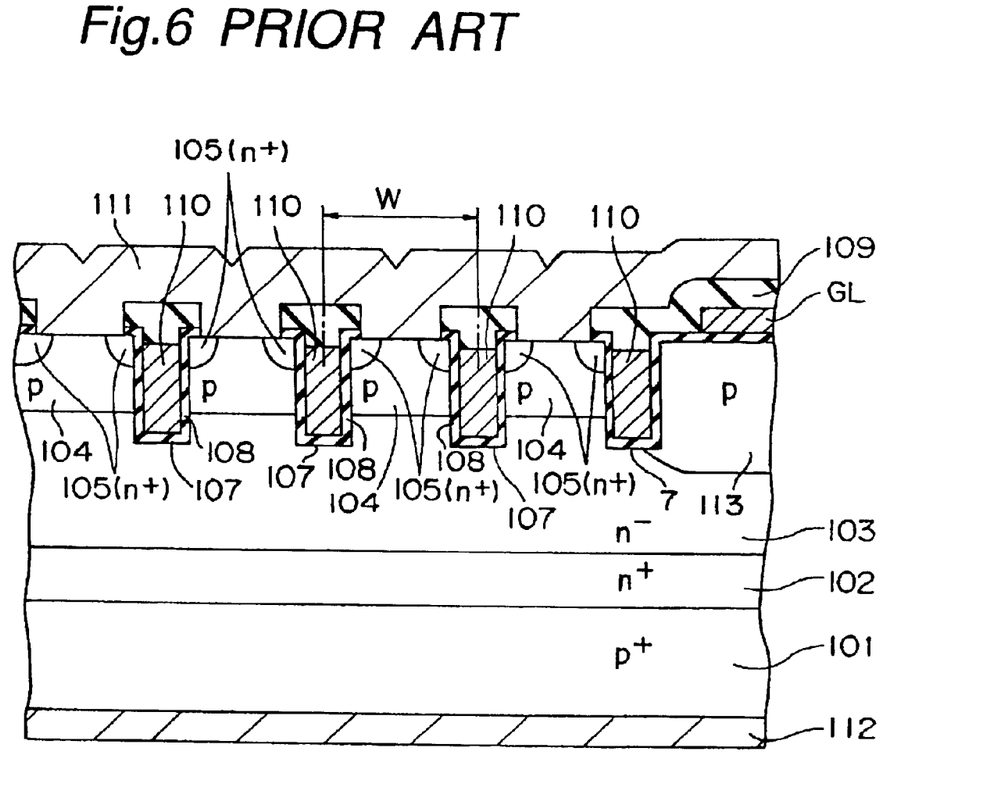
FIG. 6 is a sectional view showing an example of a structure of a conventional TIGBT.
Figure 7A:
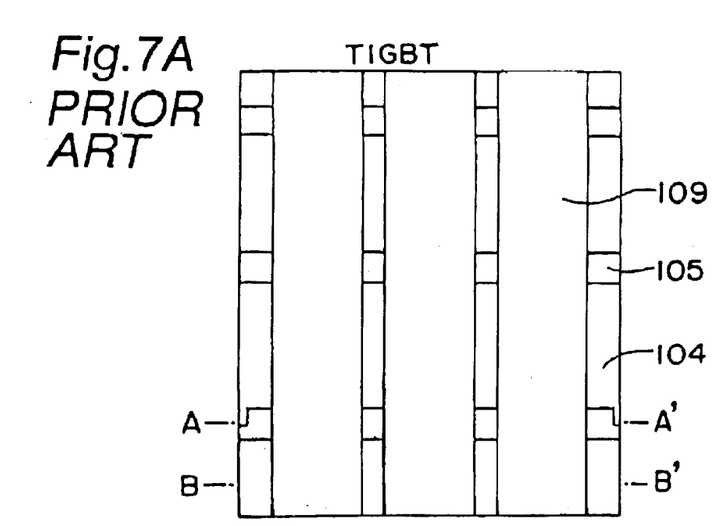
FIG. 7A is an upper plan view showing a typical conventional TIGBT.

FIG. 6 is a sectional view showing an example of a structure of a conventional trench gate IGBT (to be referred to as "TIGBT" hereinafter) An example of a typical TIGBT configuration is shown in FIG. 7A as an upper plan view thereof, and in FIGS. 7B and 7C as sectional views taken on lines A–A' and B–B' in FIG. 7A, respectively. The structure and operation of the conventional TIGBT will be briefly described below with reference to FIG. 6 and FIGS. 7A to 7C.

In the illustrated configuration, an $n^+$-type buffer layer 102 is formed on a $p^+$-type substrate 101, and a collector electrode 112 is formed on the lower surface of the $p^+$-type substrate 101. An $n^-$-type semiconductor layer (referred to as "base layer") 103 is formed on the $n^+$-type buffer layer 102. Furthermore, in a cell region of the TIGBT, a p-type base region 104 is selectively formed by diffusing a p-type impurity on the upper surface of the $n^-$-type base layer 103. In a part or the entire area of the upper surface of the p-type base region 104, an $n^+$-type emitter region 105 is formed by selectively diffusing a high concentrated n-type impurity.

In this conventional configuration, a plurality of trenches 107 are formed to extend to cross the $n^+$-type emitter region 105, and are arranged at predetermined intervals (i.e., pitches) W in parallel to each other. Each trench is formed to have such a depth that the trench extends from the level of the $n^+$-type emitter region 105 to the $n^-$-type base layer 103. A trench gate electrode 110 (110a, 110b and 110c) of the MOS transistor is buried in each of the trenches 107 through a gate insulating film 108. The p-type base region 104 opposing the gate electrode 110 and interposed between the $n^+$-type emitter region 105 and the $n^-$-type base layer 103 functions as a channel region.

The upper surface of the trench gate electrode 110 and a part of the upper surface of the $n^+$-type emitter region 105 are coated with an insulating interlayer 109, and an emitter electrode 111 is formed to cover a part of the upper surface of the $n^+$-type emitter region 105 and the entire upper surface of the insulating interlayer 109. Also, as shown in FIG. 6, a p-type semiconductor layer 113 for keeping a withstand voltage high is formed in a region immediately below a gate wiring layer GL.

Figure 7B:
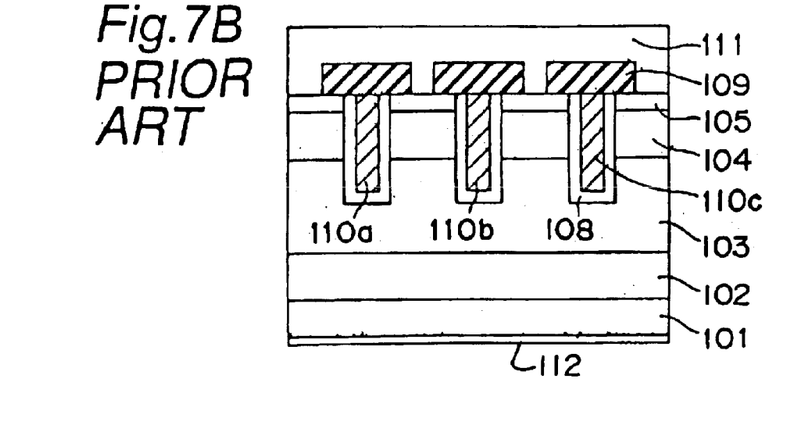
FIGS. 7B and 7C are sectional views taken on lines A–A' and B–B' in FIG. 7A, respectively.
Figure 7C:
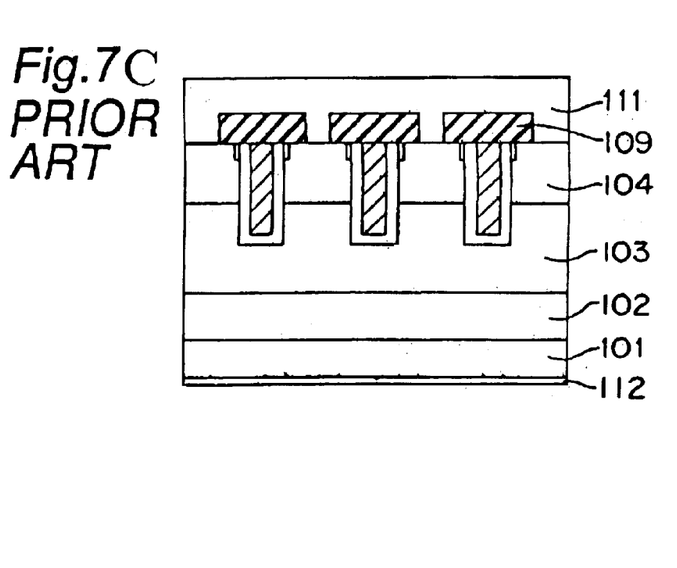
Figure 8A:
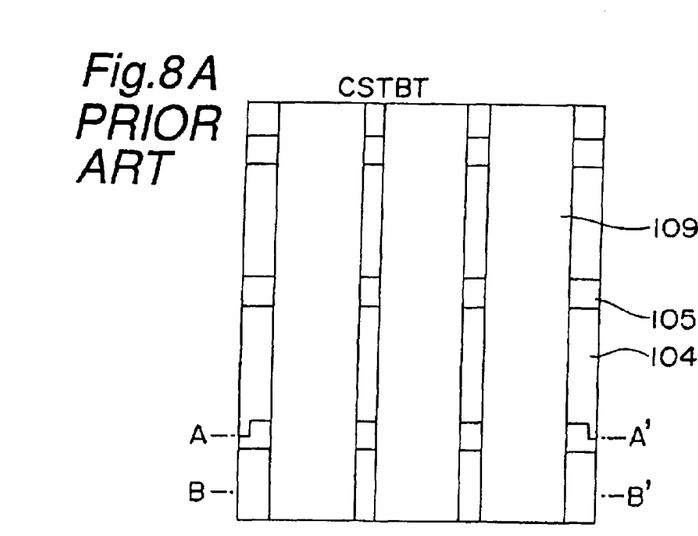
FIG. 8A is an upper plan view showing a typical conventional CSTBT.
Figure 8B:
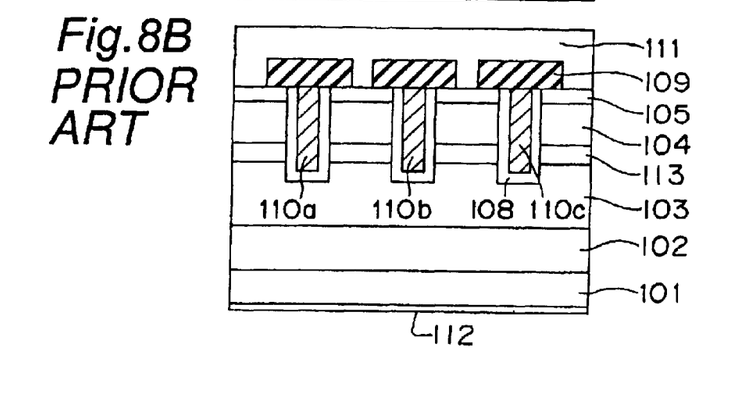
FIGS. 8B and 8C are sectional views taken on lines A–' and B–B' in FIG. 8A, respectively.
Figure 8C:
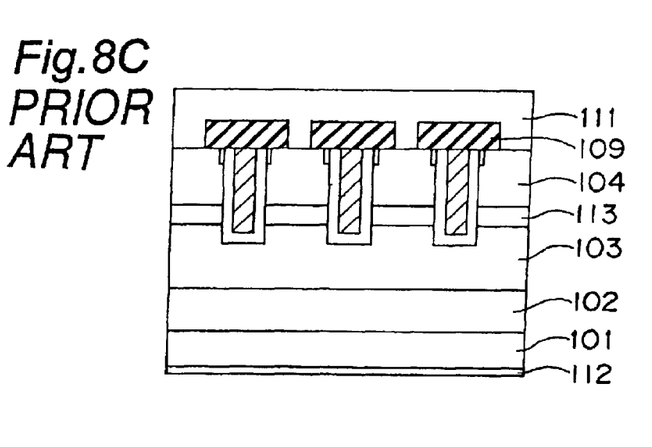

FIGS. 8A, 8B, and 8C show a typical structure of a conventional carrier stored trench-gate bipolar transistor (to be referred to as "CSTBT" hereinafter) to improve the characteristics of the TIGBT shown in FIGS. 7A–7C, where FIG. 8A is an upper plan view thereof and FIGS. 8B and 8C are sectional views taken on lines A–A' and B–B' in FIG. 8A, respectively. This improved TIGBT structure is different from the old TIGBT structure in FIGS. 7A, 7B, and 7C in that an $n^-$-type semiconductor layer (i.e., carrier stored region) 113 for storing carriers is interposed between the p-type base region 104 and the $n^-$-type base layer 103.

The operation of the conventional IGBT will be described below with reference to FIGS. 7A to 7C and FIGS. 8A to 8C. In each of the structures shown in the FIGS. 7A to 7C and FIGS. 8A to 8C, while a predetermined positive collector voltage $V_{CE}$ is applied across the emitter electrode 111 and the collector electrode 112, a predetermined positive gate voltage $V_{GE}$ is applied across the emitter electrode 111 and the trench gate electrode 110 to turn on the gate.

At this time, the type of the channel region is inverted from a p type to an n type to form a channel, and electrons are moved from the emitter electrode 111 and implanted into the $n^-$-type base layer 103. The implanted electrons set the region between the $p^+$-type substrate 101 and the $n^-$-type base layer 103 in a forward bias state. Implantation of carrier holes from the $p^+$-type substrate 101 considerably decreases the resistance of the $n^-$-type base layer 103 and increases the current capacity of the IGBT. In this manner, implantation of holes from the $p^+$-type substrate 101 in the IGBT decreases the resistance of the $n^-$-type semiconductor layer 103.

An operation performed when the IGBT is turned off will be described below. In the structures FIGS. 7A to 7C and FIGS. 8A to 8C, the gate voltage $V_{GE}$ applied across the emitter electrode 111 and the trench gate electrode 110 in the ON state is set to zero or negative (inverted vias) More specifically, when the gate is turned off, the channel region having its conductivity type inverted into an n type is returned to a p-type region, and the implantation of electrons from the emitter electrode 111 into the $n^-$-type base layer 103 is stopped. The stop of implantation of electrons causes the implantation of holes from the $p^+$-type substrate 101 to be stopped. Thereafter, the electrons and holes stored in the $n^-$-type base layer 103 (and the $n^+$-type buffer layer 102) are collected into the collector electrode 112 and the emitter electrode 111, or are combined to each other again to disappear.

The characteristics of the TIGBT shown in FIGS. 7A to 7C can be improved compared to a plane gate IGBT because MOS transistors on the upper surface of the TIGBT can be micropatterned to have a size which is about 1/10 the size of the MOS transistors of a plane gate IGBT. In the plane gate IGBT, a current path is formed in a region sandwiched by a p-type base layer on the upper surface, and a voltage drop in this region is large. However, in the above-described TIGBT, the gate 110 is formed to penetrate the p-type base region 104. For this reason, the current path has no region surrounded by the p-type base layer, so that the characteristics can be improved.

In the CSTBT shown in FIGS. 8A to 8C, the $n^-$-type semiconductor layer (carrier stored region) 113 for storing carriers is formed on the lower surface of the p-type base region 104. For this reason, holes from the p+-type substrate 101 are prevented from passing through the emitter electrode 111, and the holes are stored in the carrier stored region 113 located on the lower surface of the p-type base region 104. Therefore, ON voltage can be decreased to a voltage which is lower than that of the TIGBT.

However, in the conventional TIGBT shown in FIGS. 7A to 7C, since the cell size is reduced to a size which is about 1/10 the cell size of a plane gate, the ON voltage can be considerably reduced advantageously, but a gate capacity and a short-circuit current increase disadvantageously. In order to solve the problem, the pitches used when the trench gates are formed may be increased to increase the cell size. However, the increase in cell size causes the ON voltage of the TIGBT to increase.

On the other hand, in the CSTBT shown in FIGS. 8A to 8C, an increase in cell size suppresses the ON voltage from increasing, but a withstand voltage decreases disadvantageously. In particular, the decrease in withstand voltage fatally influences a switching element. For this reason, the above problem is not solved by only the increase in cell size.

Figure 9:
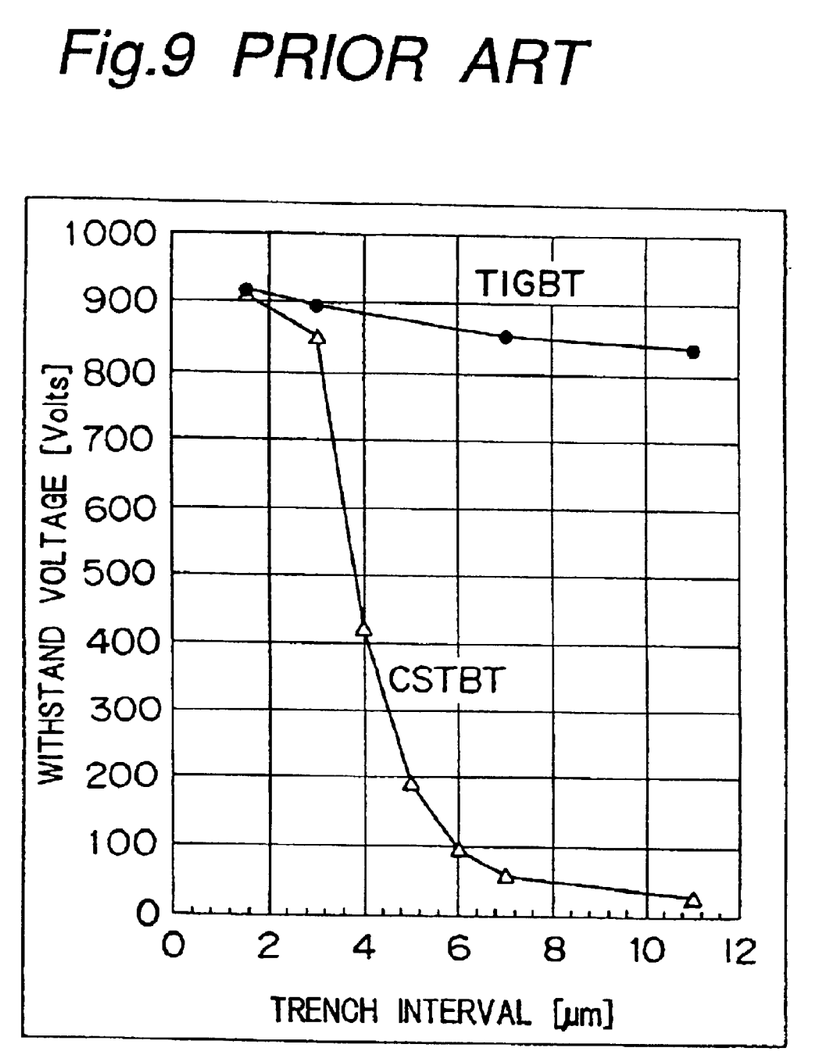
FIG. 9 is a graph showing relationships between trench intervals and changes in withstand voltage in the conventional TIGBT and CSTBT.
Figure 10:
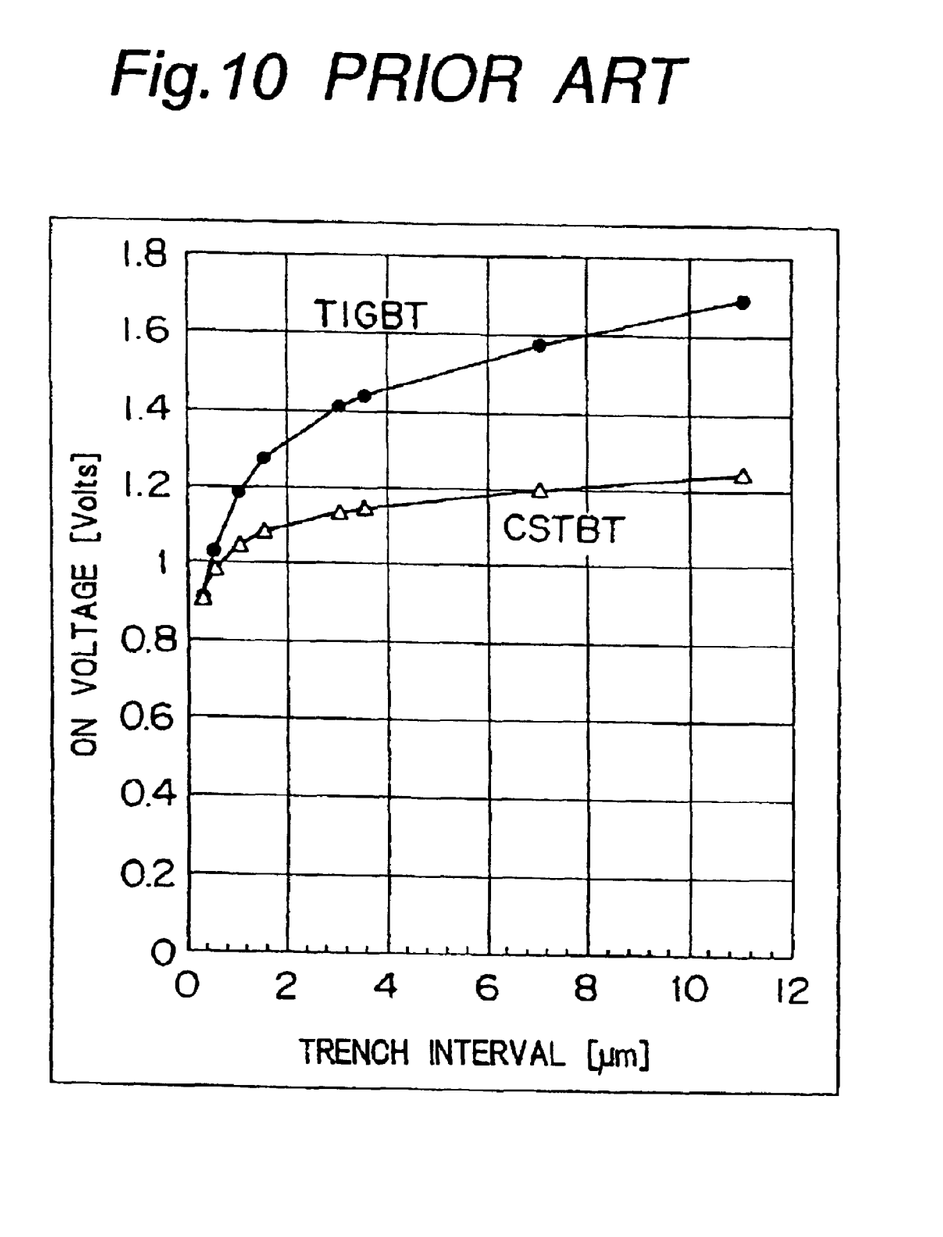
FIG. 10 is a graph showing relationships between trench intervals and ON voltages in the conventional TIGBT and CSTBT.

FIGS. 9 and 10 show results obtained such that dependencies of a change in withstand voltage (FIG. 9) and a change in ON voltage (FIG. 10) when p-type base intervals (trench pitches) W are increased in the TIGBT and the CSTBT are calculated by using device simulation. In this case, the conventional TIGBT and the conventional CSTBT are designed such that the p-type base intervals are set to be 3 µm. In this device simulation, the results are obtained when the trench intervals (p-type base intervals) are changed to 11 µm. When the trench intervals are 11 µm, the cell size is three times a conventional cell size, and the gate capacity is 1/3 compared to a conventional gate capacity.

As is apparent from the simulation calculation results shown in FIGS. 9 and 10, in the TIGBT (indicated by ●), the increase in trench interval does not largely change the withstand voltage as shown in FIG. 9, but the increase in trench interval sharply increases the ON voltage as shown in FIG. 10.

On the other hand, in the CSTBT (indicated by Δ), the increase in trench interval does not largely change the ON voltage as shown in FIG. 10, the increase in trench interval sharply decreases the withstand voltage as shown in FIG. 9. When the trench interval is 5 µm, the withstand voltage was 200 V or less, and when the trench interval is 6 µm, the withstand voltage is 100 V or less. When the trench interval is 6 µm, the withstand voltage is 100 V or less. When the trench interval is larger than 6 µm, the withstand voltage is almost 0V. As described above, when the trench interval is increased to decrease the gate capacity and the short-circuit current (i.e., the cell size is increased), an increase in ON voltage (in the TIGBT) or a decrease in withstand voltage (in the CSTBT) are caused.

Figure 11A:
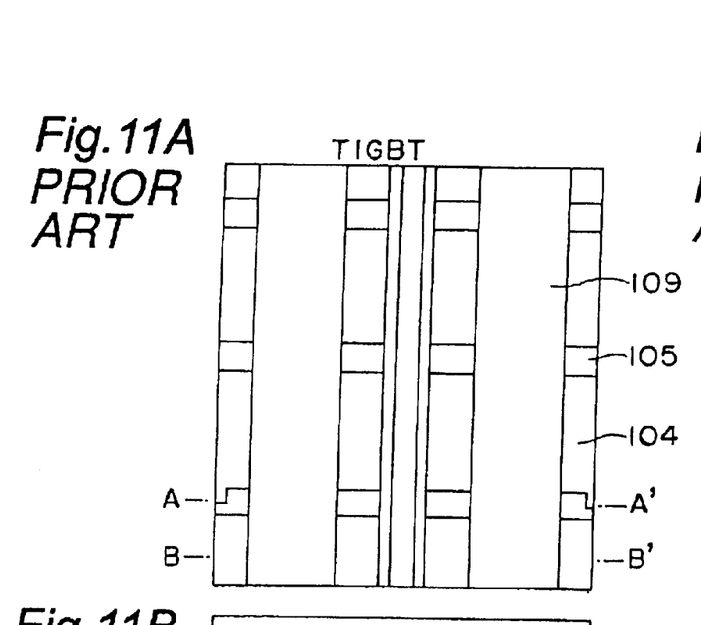
FIG. 11A is an upper plan view showing a typical conventional improved TIGBT.
Figure 11B:
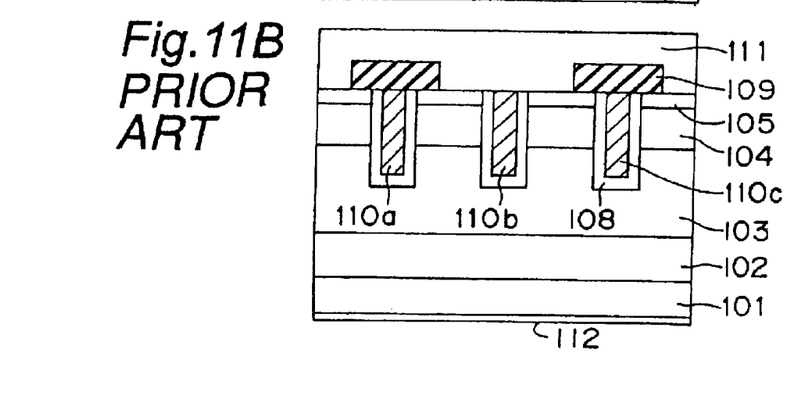
FIGS. 11B and 11C are sectional views taken on lines A–A' and B–B' in FIG. 11A, respectively.
Figure 11C:
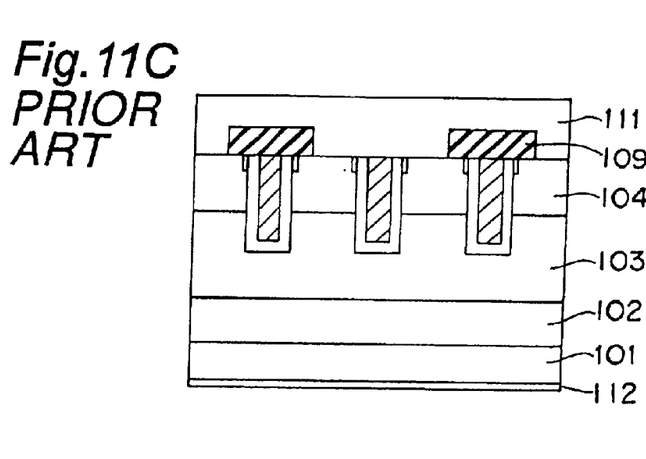
Figure 12A:
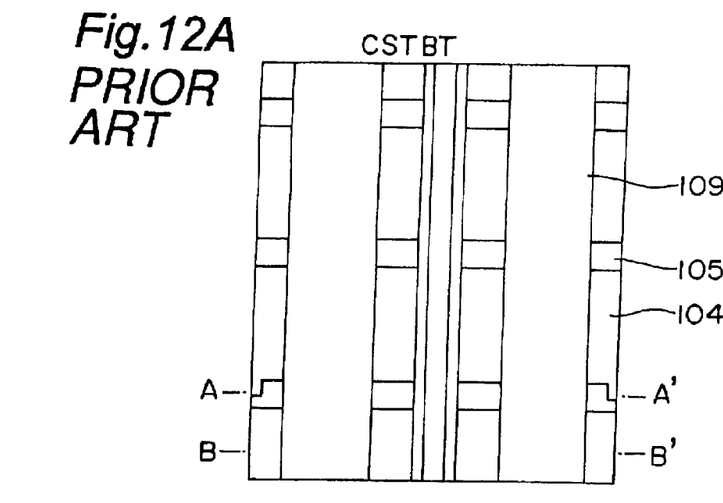
FIG. 12A is an upper plan view showing a typical conventional improved CSTBT.
Figure 12B:
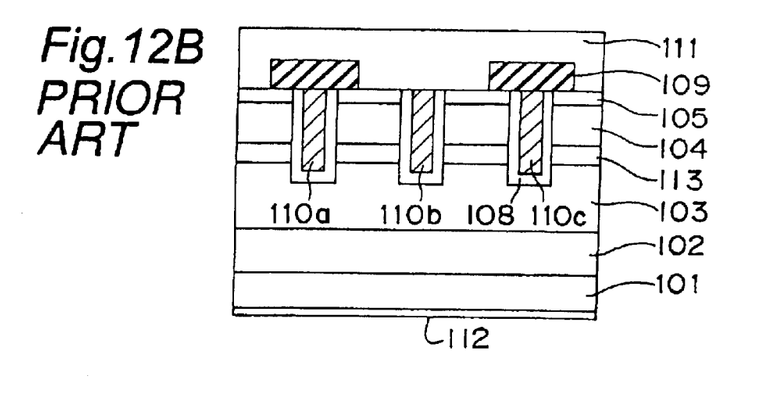
FIGS. 12B and 12C are sectional views taken on lines A–A' and B–B' in FIG. 12A, respectively.
Figure 12C:
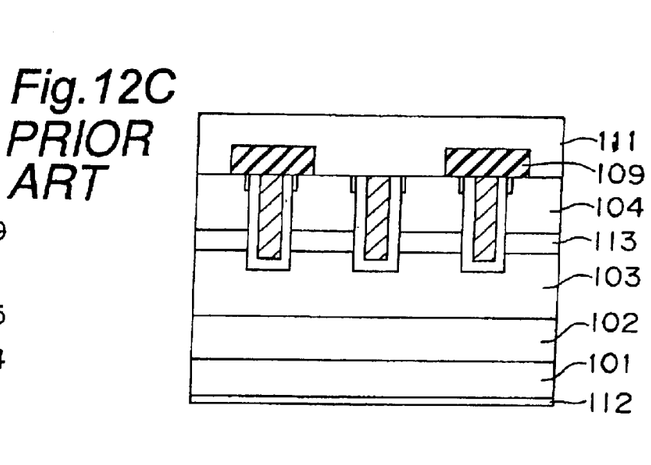

As conventional improved versions of the conventional TIGBT and CSTBT, as shown in FIGS. 11A, 11B, and 11C (TIGBT) and FIGS. 12A, 12B, and 12C (CSTBT), there are devised improved versions of constitutions in which gate electrodes 110 formed in trenches and emitter electrodes 111 are connected to each other without changing pitches at which the trench gates are formed. More specifically, in each of the configurations shown in FIGS. 11A to 11C and FIGS. 12A to 12C, the emitter electrode 111 is connected to the upper surface of the second gate electrode portion 110b.

Each of these configurations means that the cell of the second gate electrode portion 110b connected to the emitter electrode 111 is a dummy gate region which has a gate voltage $V_{GE}$ of 0 V and which does not function as a gate. Although the TIGBT and the CSTBT have the same sizes as those of the conventional TIGBT and the CSTBT which are shown in FIGS. 7A to 7C and FIGS. 8A to 8C, the TIGBT and the CSTBT advantageously do not cause the withstand voltages to decrease.

On the other hand, power semiconductor elements such as IGBTs or diodes are mounted in one package, and are frequently used in a power conversion device as a power module. At this time, the connection between an electrode of the power module and the power semiconductor element is generally performed by ultrasonic connection using, for example, an aluminum wire or the like. However, the power semiconductor element handles a very high power, and has a limit (power cycle length) at which the joint portion between the aluminum wire and the emitter electrode is finally peeled by a temperature cycle, which is a factor of determining the life of the power module.

Increases of the joint strength and the joint area between the aluminum wire and the emitter electrode are effective to improve the power cycle length. However, in a configuration using the TIGBT and the CSTBT shown in FIGS. 11A to 11C and FIGS. 12A to 12C, a crack extending from the connection region between the emitter electrode 111 and the second gate electrode 110b may be generated to increase a probability that a gate short circuit or a withstand-voltage short circuit occurs disadvantageously. It may be considered as a factor that a stress caused by the ultrasonic connection easily spreads inside the silicon gate electrode because the joint strength is relatively high between the emitter electrode and the second gate electrode being in contact with the emitter electrode.

SUMMARY OF THE INVENTION

The present invention has been made to solve the above problems, and has as its object to provide an insulated gate semiconductor device and a method of manufacturing the insulated gate semiconductor device which can control a gate capacity and suppress a short-circuit current in wire bonding connection, and which can maintain a preferable power cycle length.

In order to achieve the above object, in one aspect of the present invention, an insulated gate semiconductor device includes: a semiconductor substrate of a first conductivity type; a collector region of a second conductivity type formed on a lower major surface of the semiconductor substrate; a collector electrode connected to the collector region; a base region of the second conductivity type selectively formed on an upper major surface of the semiconductor substrate; an emitter region of the first conductivity type selectively formed in the base region; and a plurality of trenches including first, second, and third trenches selectively formed in the base region, each of the trenches having a depth passing through the base region and reaching the semiconductor substrate. First, second, and third gate electrodes buried in the first, second, and third trenches through insulating films, respectively, and the base region, emitter region, and second gate electrode are commonly connected to an emitter electrode, wherein the third gate electrode is connected to only the first gate electrode, and the emitter electrode is partially connected to the second gate electrode.

In another aspect of the present invention, a method of manufacturing an insulated gate semiconductor device includes the steps of: forming a collector region of a second conductivity type on a lower major surface of a semiconductor substrate of a first conductivity type; forming a collector electrode connected to a lower major surface of the collector region; selectively forming a base region of the second conductivity type on an upper major surface of the semiconductor substrate; selectively forming an emitter region of the first conductivity type in the base region; and selectively forming a plurality of trenches including first, second, and third trenches in the base region, each of the trenches having a depth passing through the base region and reaching the semiconductor substrate. First, second, and third gate electrodes are buried in the first, second, and third trenches through insulating films, respectively and there is formed an emitter electrode to which upper surface portions of the base region, emitter region and second gate electrode are commonly connected, wherein the third gate electrode is connected to only the first gate electrode, and the second gate electrode is partially connected to the emitter electrode.

According to the present invention, there can be obtained an effect that, when an aluminum wire is connected by an emitter electrode by ultrasonic connection, a portion where a stress directly acts on a polysilicon surface of a gate electrode can be reduced. Therefore, the conventional problem that a crack occurrence from a connection region between an emitter electrode and a second gate electrode can be solved and a gate short circuit and a withstand-voltage short circuit can be effectively suppressed from being generated.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

DETAILED DESCRIPTION OF THE PREFERRED EMBODIMENTS

Preferred embodiments of the present invention will be described below with reference to FIGS. 1 to 5 by using a CSTBT as a typical example. However, the present invention is not limited to the CSTBT, and can also be applied to other IGBTs and MOS transistors. It is to be noted that, since the basic structures of the preferred embodiments are in common, like parts are designated by the same reference numerals in these drawings, and a description thereof will be omitted here.

First Embodiment

Figure 1A:
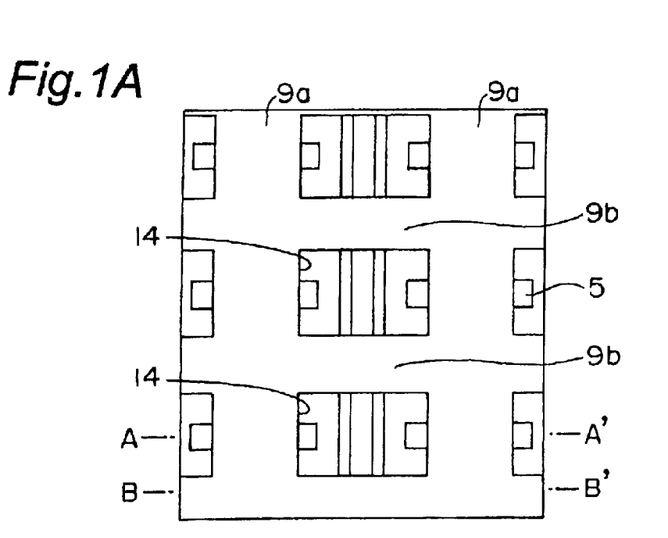
FIG. 1A is an upper plan view showing a typical semiconductor device according to the first embodiment of the present invention.
Figure 1B:
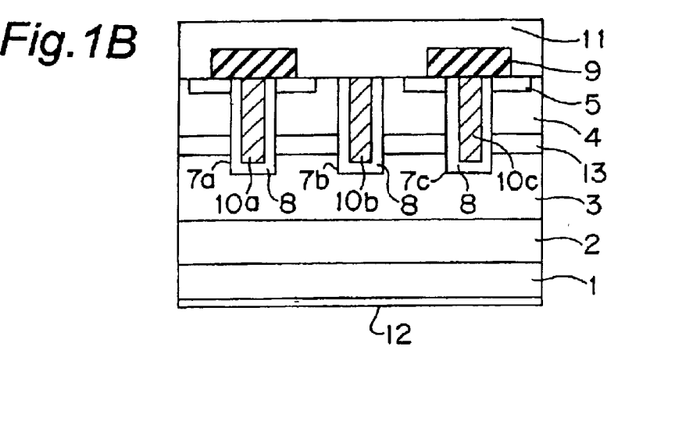
FIGS. 1B and 1C are sectional views taken on lines A–A' and B–B' in FIG. 1A, respectively.
Figure 1C:
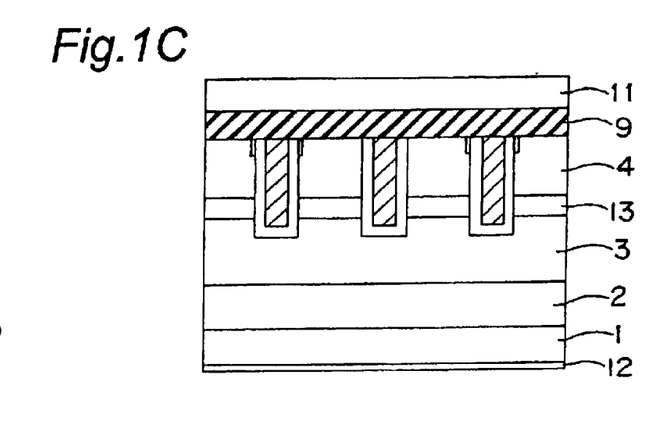

FIGS. 1A, 1B, and 1C show a typical example of a CSTBT configuration according to the first embodiment, where FIG. 1A is an upper plan view thereof, and FIGS. 1B and 1C are sectional views taken on lines A–A' and B–B' in FIG. 1A, respectively. The CSTBT according to this embodiment is different from a conventional configuration shown in FIGS. 12A to 12C in that an insulating interlayer 9 is also formed as a connection portion on a second gate electrode connected to an emitter electrode such that the insulating interlayer 9 partially orthogonally crosses the second gate electrode.

More specifically, a lateral insulating interlayer connection portion 9b extending in a lateral direction is formed as a bridge shape integrally with a longitudinal insulating interlayer portion 9a extending in a longitudinal direction on a gate electrode (10a, 10c), to define a plurality of square windows 14 in which the insulating interlayer portion is not formed. The square windows 14 are arranged at regular intervals above the second electrode 10b. This structure of the CSTBT will be described below with reference to FIG. 1.

In the illustrated configuration, an n$^+$-type buffer layer 2 is formed on the upper surface of a p$^+$-type substrate 1, a collector electrode 12 is formed on the lower surface of the p$^+$-type substrate 1, and thus the p$^+$-type substrate 1 functions as a collector region. An n$^-$-type semiconductor layer (referred to as "base layer" hereinafter) 3 is formed on the upper surface of the n$^+$-type buffer layer 2. Furthermore, in a cell region, there is formed an n$^-$-type layer (referred to as "carrier stored region" hereinafter) 13 on the upper surface of the n$^-$-type base layer 3 for storing carriers. The carrier stored region 13 has an impurity concentration higher than that of the n$^-$-type base layer 3. A p-type base region 4 is selectively formed on the upper surface of the carrier stored region 13 by diffusing a p-type impurity. On a part of the upper surface of the p-type base region 4, n$^+$-type emitter regions 5 are formed by selectively diffusing a concentrated n-type impurity.

In this configuration, the n$^-$-type carrier stored region 13 for storing carriers is interposed between the p-type base region 4 and the n⁻-type base layer 3, and a plurality of trenches 7 (indicated by reference numerals 7a, 7b, and 7c) are formed in stripes such that the trenches extend in a direction orthogonally crossing the longitudinal direction of the n⁺-type emitter region 5, and the trenches are arranged in parallel to each other at predetermined intervals of pitches W (see FIG. 6). The trenches 7 are formed to have such a depth that the trenches 7 extend from the level of the n⁺-type emitter region 5 into the n⁻-type base layer 3, and trench gate electrodes 10 (indicated by reference numerals 10a, 10b, and 10c) of MOS transistors are buried in the trenches 7, respectively.

More specifically, the trench gate electrodes 10 made of polysilicon or the like material are buried in the trenches 7 through gate insulating films 8. The p-type base region 4 opposing the gate electrodes 10 through the gate insulating films 8 are interposed between the n⁺-type emitter region 5 and the carrier stored region 13 so that the p-type base region 4 functions as a channel region.

The insulating interlayer 9 is properly formed by a mask pattern to cover the entire upper surfaces of the first and third gate electrodes 10a and 10c and cover a part of a region of the upper surface of the n⁺-type emitter region 5. An emitter electrode 11 is formed to cover a part of the upper surfaces of the p-type base region 4, second gate electrode 10b, and a region which is not coated by the insulating interlayer 9 of the upper surface of the n⁺-type emitter region 5, and the entire upper surface region of the insulating interlayer 9. In this manner, the emitter electrode 11 are commonly connected to the base region 4, emitter region 5, and second gate electrode 10b, so that the emitter electrode 11 and the collector electrode 12 function as a pair of main electrodes.

In the first embodiment, the above configuration is characterized in that, as shown in FIG. 1A, the lateral insulating interlayer connection portion 9b is also formed on a part of the second gate electrode 10b connected to the emitter electrode 11 such that the insulating interlayer connection portion 9b orthogonally crosses the second gate electrode 10b. More specifically, the insulating interlayer connection portion 9b extending in the lateral direction is formed to integrally bridge with the longitudinal insulating interlayer portion 9a extending in the longitudinal direction on the gate electrodes 10a and 10c, and the plurality of square windows 14 are formed in the insulating interlayer portion 9 having a pattern such that the square windows 14 are located on the second gate electrode 10b. The second gate electrode surface portion located in the windows 14 is directly connected to the emitter electrode 11 through the windows 14, so that the second gate electrode 10b and the emitter electrode 11 are partially connected to each other. On the upper surface portion of the p-type base region 4, the n⁺-type emitter regions 5 are selectively formed to be closely adjacent to upper portions of the outer side walls of the first and third trenches 7a and 7c.

The lateral insulating interlayer connection portion 9b formed on the second gate electrode 10b can be easily formed in the following manner. That is, for example, when an insulating oxide film is formed on the first or third gate electrode 10a or 10c, a mask pattern is changed to be set such that the insulating oxide film is left on the second gate electrode 10b to cross the second gate electrode.

In the IGBT shown in FIGS. 1A to 1C, since the MOS transistors on the upper surface can be micropatterned to have a size which is about ¹/₁₀ the size of the MOS transistors of a plane gate IGBT, the characteristics can be improved. In the conventional plane gate IGBT, a current flows in a current path formed in a region surrounded by a p-type base layer on the upper surface, and a voltage drop is large in this portion. In contrast, in the IGBT of the present embodiment, since the gate electrode 10 is formed to pass through the p-type base region 4 and the carrier stored region 13, a current path is not surrounded by the p-type base layer, and the characteristics can be improved.

The n⁻-type carrier stored region 13 for storing carriers is formed on the lower surface of the p-type base region 4. For this reason, carrier holes from the p⁺-type substrate 1 can be prevented from passing to the emitter electrode 11, and the carrier holes are stored in the carrier stored region 13 located under the p-type base region 4. Thus, a lower ON voltage can be achieved in this embodiment than that in a TIGBT having no carrier stored region.

In the CSTBT configuration shown in FIGS. 1A to 1C, the cell of the second gate electrode 10b which is connected to the emitter electrode 11 has a gate voltage $V_{GE}$ of 0 V, and does not function as a gate but functions as a dummy gate region. Therefore, the CSTBT does not cause a withstand voltage to decrease even though the CSTBT employs a cell size equal to that of the conventional TIGBT and the conventional CSTBT shown in FIGS. 7A to 7C and FIGS. 8A to 8C. For example, in a trench gate region arranged in the form of stripes, when two of the three trench gates are connected to the emitter electrode 11, a gate capacity and a short-circuit current can be suppressed to ⅓. In other words, this means that the gate capacity and the short-circuit current can be relatively freely selected.

As is apparent from the results of the device simulations shown in FIGS. 9 and 10 used in the description of the prior art, an ON voltage increases in the TIGBT, but since an increase in ON voltage is small in the CSTBT, the CSTBT is preferable as a power semiconductor element than the TIGBT.

As described above, in the first embodiment, the lateral insulating interlayer connection portion 9b is formed as to orthogonally cross the second gate electrode 10b, and the lateral insulating interlayer connection portion 9b is formed to integrally bridge with the longitudinal insulating interlayer portions 9a extending in the longitudinal direction on the first and third gate electrodes, so that the second gate electrode 10b is connected to the emitter electrode 11 through the windows 14 defined in the insulating interlayer 9.

For this reason, when an aluminum wire (not shown) and the emitter electrode 11 are connected to each other by ultrasonic connection, a portion where a stress acts on the polysilicon surface of the trench gate electrodes 10 can be reduced. Therefore, the conventional problem of a crack occurrence from a connection region between the emitter electrode 11 and the second gate electrode 10b can be solved, and a gate short circuit and a withstand-voltage short circuit can be effectively suppressed from being generated.

Second Embodiment

Figure 2A:
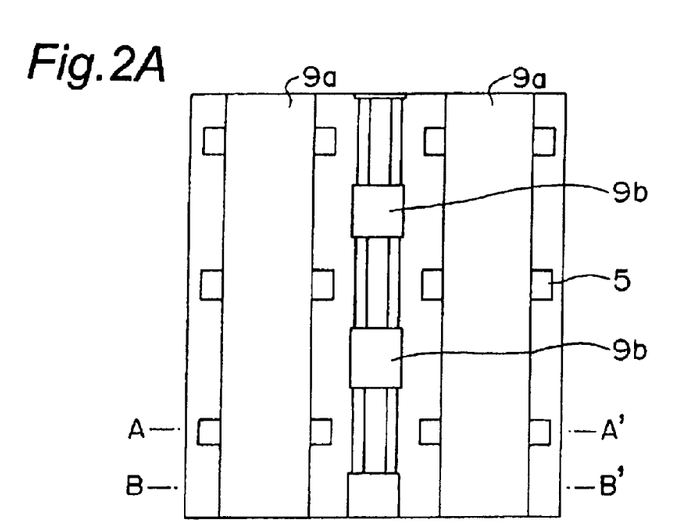
FIG. 2A is an upper plan view showing a typical semiconductor device according to the second embodiment of the present invention.
Figure 2B:
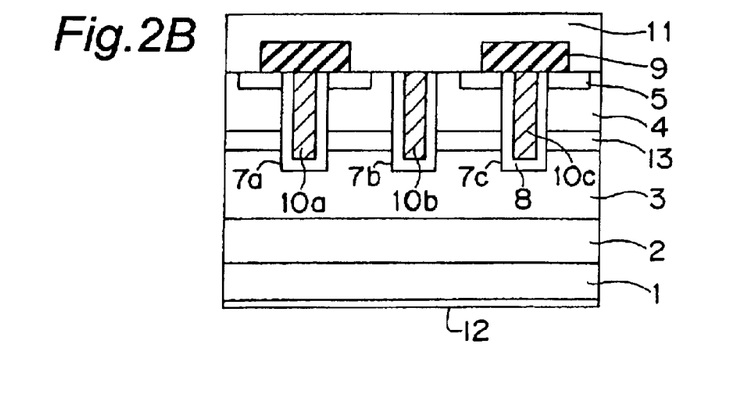
FIGS. 2B and 2C are sectional views taken on lines A–A' and B–B' in FIG. 2A, respectively.
Figure 2C:
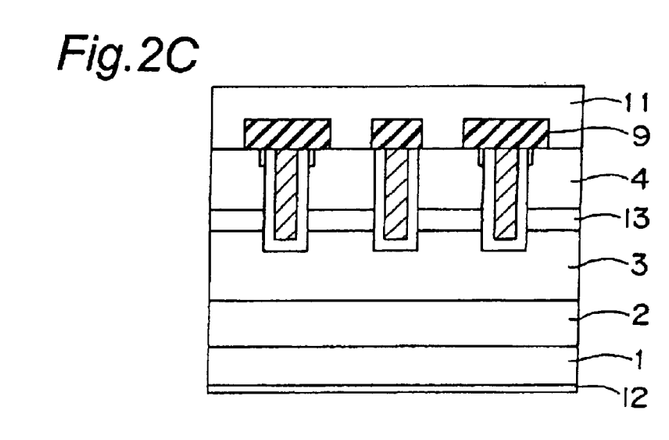

FIGS. 2A, 2B, and 2C show a CSTBT according to the second embodiment of the present invention, where FIG. 2A is an upper plan view thereof and FIGS. 2B and 2C are sectional views taken on lines A–A' and B–B' in FIG. 2A, respectively. The basic configuration of the second embodiment is similar to that of the first embodiment described above.

The second embodiment is different from the first embodiment in that the lateral insulating interlayer portion 9b is divided into a plurality of square insulating interlayer portions 9b individually separated from the longitudinal insulating interlayer portion 9a. Thus, the individual square insulating interlayer portions 9b are arranged on the second gate electrode for realizing the partial connection between the emitter electrode and the second gate electrode.

More specifically, in the configuration of the CSTBT described in the first embodiment, since the lateral insulating interlayer connection portion 9b is integrally connected between the longitudinal insulating interlayer portions 9a extending in the longitudinal direction on the first and third gate electrodes as shown in FIG. 1C, there is a part of the p-type base region 4 which cannot be partially connected to the emitter electrode 11 due to interposition of the insulating interlayer 9.

This means that, as described in the operation of the prior art, in a turn-off state of a CSTBT, when carrier holes stored in the n⁻-type base layer go to the emitter electrode 11 through the p-type base region, the path (hole path) decreases.

In this manner, when the hole current path excessively decreases, a hole current is easily concentrated. As a result, when a large current flows such as a load short circuit or the like occurs, a CSTBT latch-up phenomenon easily occurs. Therefore, it is preferable that a hole current path is maximally secured.

For this reason, as shown in FIG. 2A in the second embodiment, a plurality of square insulating interlayer portions 9b are separately arranged on the second gate electrode 10b so that the second gate electrode 10b partially connects to the emitter electrode 11.

In this manner, in a turn-off state of the CSTBT, there can be secured a carrier hole path in which the holes stored in the n⁻-type base layer 3 move to the emitter electrode 11 through the p-type base region 4. With this configuration, a crack occurrence from a connection region between the emitter electrode and the second gate electrode can be effectively suppressed.

Third Embodiment

The basic configuration of a CSTBT according to the third embodiment of the present invention is similar to each of the configurations of the first embodiment and the second embodiment described above. The configuration of the third embodiment is different form the configuration of the first or second embodiment in the following point.

That is, in the third embodiment, a ratio of a connection area S2 between the second gate electrode portion which is not coated with an insulating interlayer 9b and the emitter electrode to the entire area S1 exposed on the semiconductor surface of the second gate electrode formed in the second trench is given by S2/S1<70%.

Figure 3:
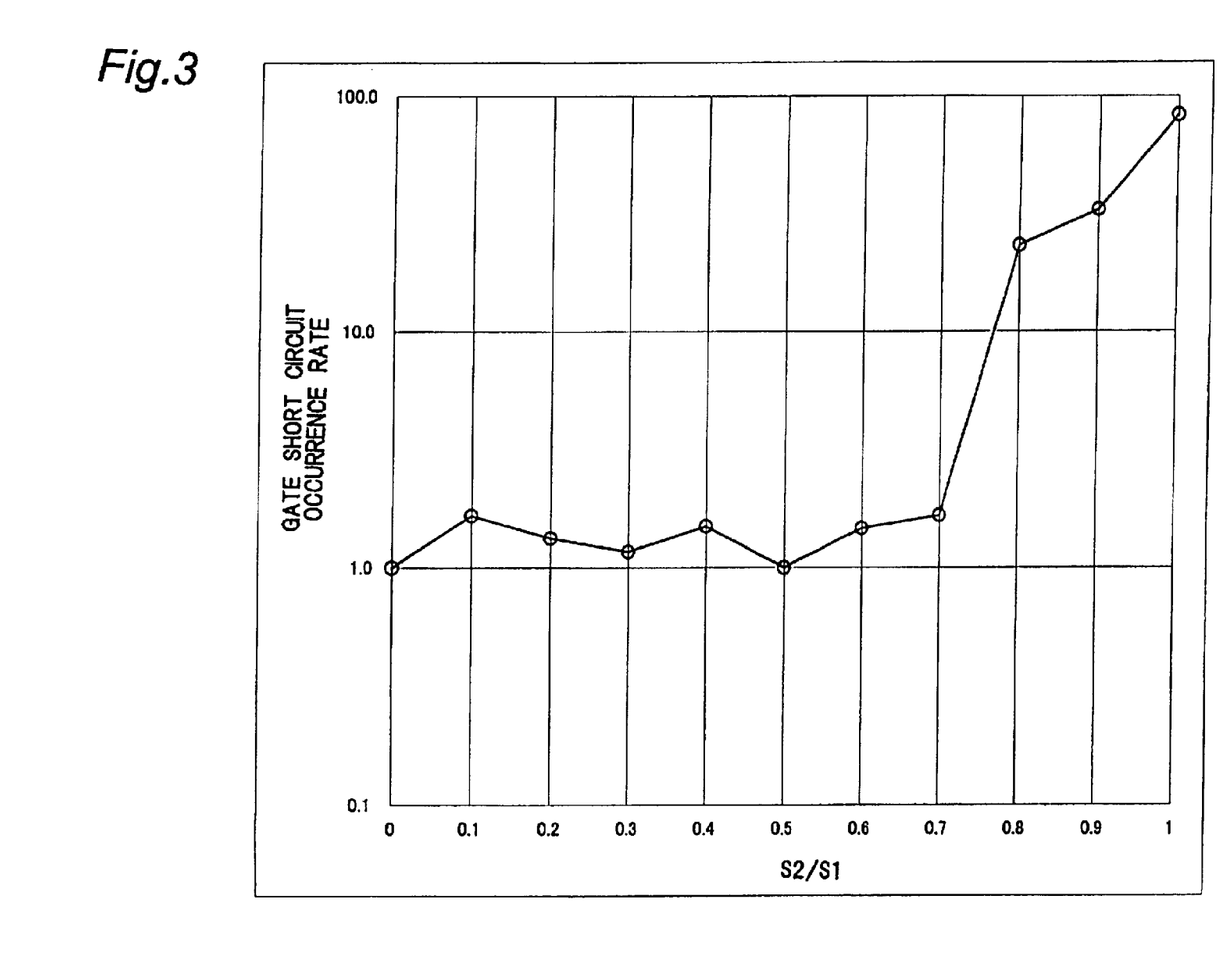
FIG. 3 is a graph for explaining characteristics related to a joint area of a second gate electrode of a CSTBT according to the third embodiment of the present invention.

FIG. 3 is a graph for explaining the characteristics of the CSTBT according to the third embodiment. FIG. 3 shows an occurrence rate of a gate short circuit caused by generation of a crack when an aluminum wire is connected to the emitter electrode, by changing a rate of a connection area S2 between the emitter electrode and the second gate electrode to the entire surface area S1 of the second gate electrode. The vertical axis of FIG. 3 represents the occurrence rate as a relative value in relation to a base value 1 thereof which the base value 1 is represented in the case of having no connection area (S2=0) between the emitter electrode and the second gate electrode, and the horizontal axis of FIG. 3 represents the rate of S2/S1.

As is apparent from the result shown in FIG. 3, the rate of occurrence of a gate short circuit sharply increases from a point at which the ratio of the connection area S2 between the second gate electrode and the emitter electrode to the entire surface area S1 thereof exceeds about 70%. This means that the insulating interlayer formed between the emitter electrode and the second electrode moderates a stress generated by ultrasonic to the inside of the silicon gate electrode.

From the above result, the connection area S2 between the emitter electrode and the second gate electrode is preferably set to be smaller than 70% of the surface area S1 of the emitter electrode corresponding to the exposed semiconductor surface of the second gate electrode. With this configuration, a gate short circuit caused by a crack can be effectively prevented from occurring.

Fourth Embodiment

Figure 4A:
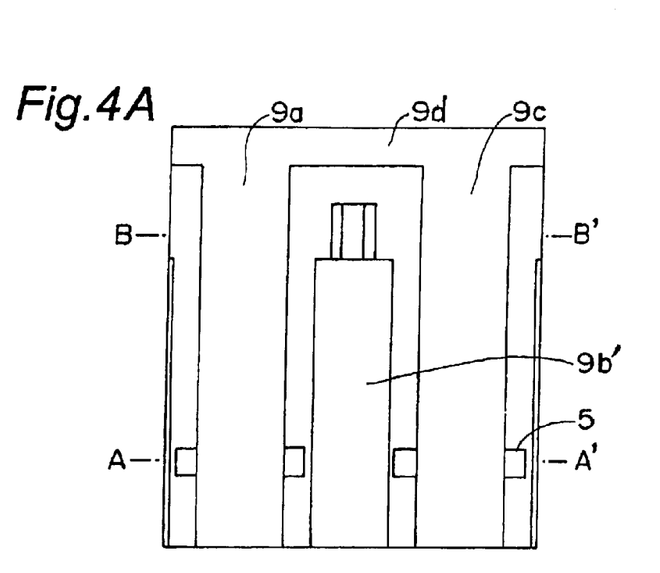
FIG. 4A is an upper plan view showing a typical semiconductor device according to the fourth embodiment of the present invention.
Figure 4B:
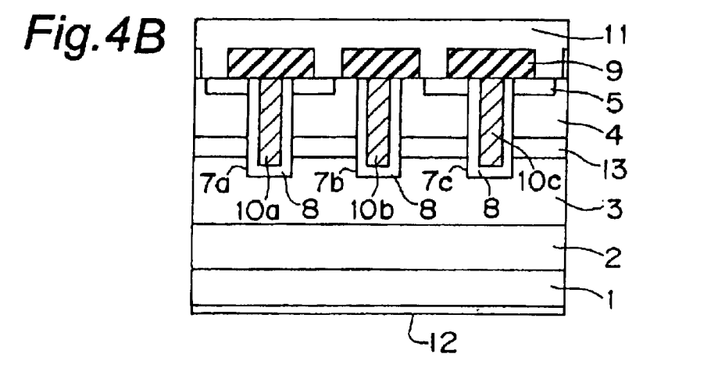
FIGS. 4B and 4C are sectional views taken on lines A–A' and B–B' in FIG. 4A, respectively.
Figure 4C:
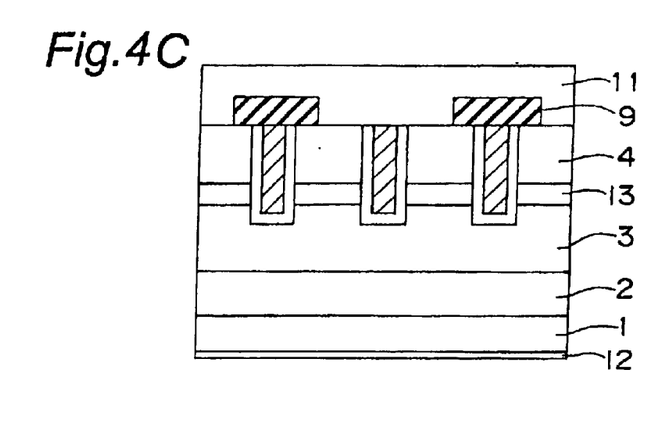

FIGS. 4A, 4B, and 4C show a CSTBT according to the fourth embodiment of the present invention, where FIG. 4A is an upper plan view and FIGS. 4B and 4C are sectional views taken on lines A–A' and B–B' in FIG. 4A, respectively. The basic configuration of the CSTBT according to the fourth embodiment is similar to that of each of the first to third embodiments.

The configuration in the fourth embodiment is different from the configuration in each of the first to third embodiments in that, when an emitter electrode is connected to an aluminum wire by ultrasonic connection, the emitter electrode and the second gate electrode are connected to each other in a portion except for a region immediately below a connection portion of the emitter electrode connected to the aluminum wire.

As described in the third embodiment, a ratio of the connection area between the emitter electrode and the second gate electrode to the surface area of the emitter electrode is preferably as small as possible. For this reason, in the fourth embodiment, as shown in FIGS. 4A, 4B, and 4C, the structure of the terminal portions of first to third gate electrodes are improved, so that the connection area between the emitter electrode and the second gate electrode can be suppressed to the minimum.

More specifically, all the terminal portions of the first to third gate electrodes are connected to an aluminum electrode (not shown) at the same portion, and the longitudinal insulating interlayers 9a and 9c coating the first and third gate electrodes are formed integrally with a terminal connection insulating film portion 9d which is extending in a lateral direction like a bridge.

On the other hand, at the terminal portion of the second gate electrode, an area having no insulating interlayer 9b formed thereon is defined to be connected to the emitter electrode. The other portion than the terminal portion of the second gate electrode has an upper surface coated with another longitudinal insulating interlayer 9b'.

With this arrangement configuration, the second gate electrode portion located immediately below an emitter electrode portion connected to the aluminum wire by ultrasonic connection has an upper surface coated with the insulating interlayer 9b'. For this reason, occurrence of a gate short circuit caused by a crack can be suppressed to the minimum.

Figure 5:
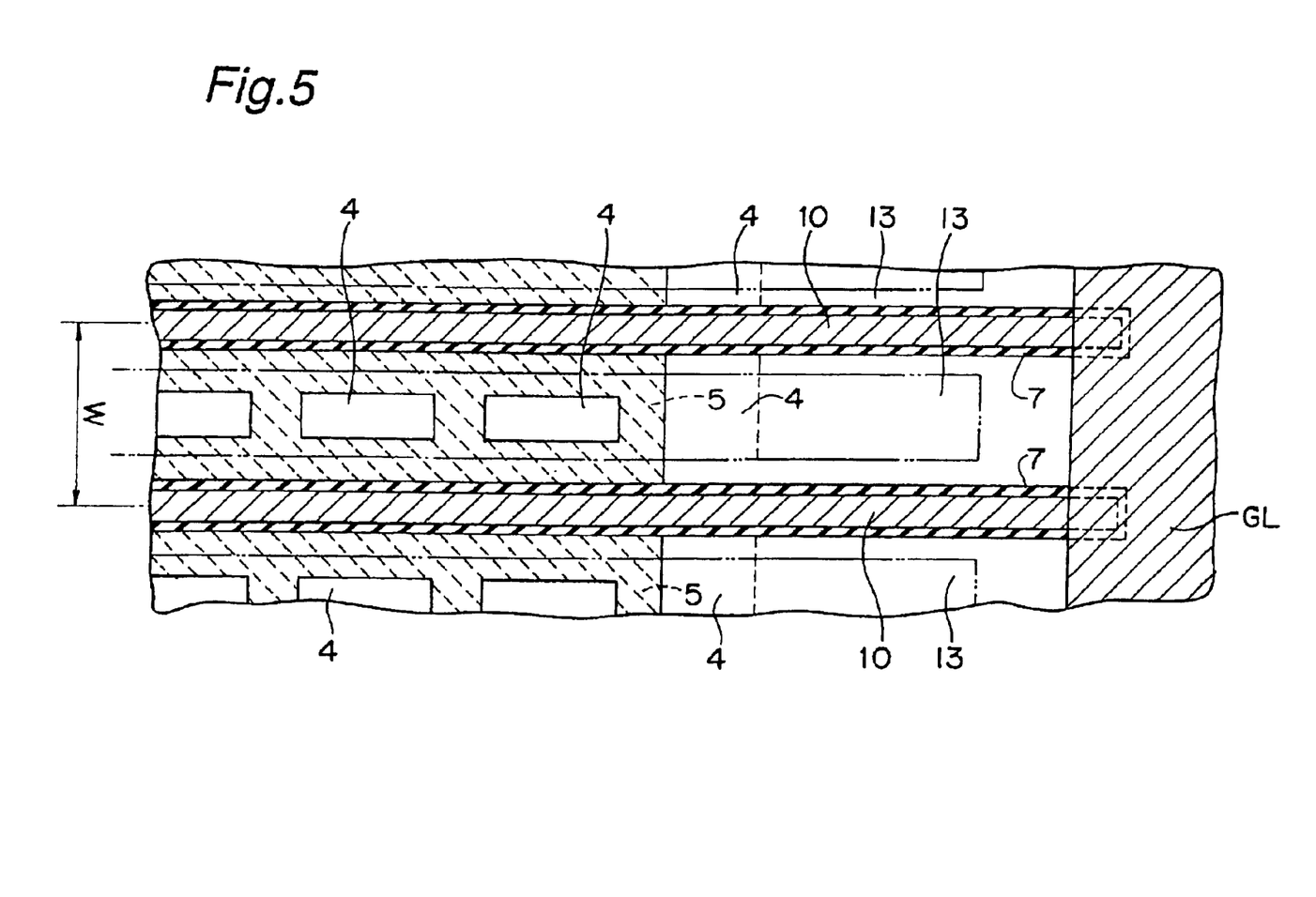
FIG. 5 is a sectional view showing an arrangement configuration of a gate wiring electrode in one embodiment of the present invention.

Also, in the above configuration, with respect to the arrangement configuration of a gate wiring electrode GL shown in FIG. 6, a preferable embodiment is shown in FIG. 5, where a gate wiring electrode GL orthogonally crosses the terminals of the first (or third) trench and the second trench. The gate wiring electrode may be connected to only the first (and third) gate electrodes, while the second gate electrode may be connected to the emitter electrode only in a region near the gate wiring electrode.

In the first to fourth embodiments of the present invention, explanations are made by using a CSTBT as a typical example. However, the present invention is not limited to the CSTBT, and can be easily applied to a TIGBT having trench gates, a MOSFET, and the like by changing only masking designs.

In the present invention, when an insulating interlayer, which is formed on only a first gate electrode in the prior art, is also partially arranged on a second gate electrode, a stress generated by ultrasonic for bonding an aluminum wire can be moderated, and a gate short circuit and a withstand-voltage short circuit caused by a crack can be suppressed from occurring. Therefore, field effect semiconductor devices can be manufactured at a stable yield.

As has been described above, according to a first aspect of the present invention, there is provided an insulated gate semiconductor device which includes: a semiconductor substrate of a first conductivity type; a collector region of a second conductivity type formed on a lower major surface of the semiconductor substrate; a collector electrode connected to the collector region; a base region of the second conductivity type selectively formed on an upper major surface of the semiconductor substrate; an emitter region of the first conductivity type selectively formed in the base region; and a plurality of trenches including first, second, and third trenches selectively formed in the base region, each of the trenches having a depth passing through the base region and reaching the semiconductor substrate. The semiconductor device further includes: first, second, and third gate electrodes buried in the first, second, and third trenches through insulating films, respectively; and an emitter electrode to which the base region, emitter region, and second gate electrode are commonly connected, wherein the third gate electrode is connected to only the first gate electrode, and the emitter electrode is partially connected to the second gate electrode.

With the above configuration, when an aluminum wire is connected by an emitter electrode by ultrasonic connection, there can be reduced a portion where a stress directly acts on a polysilicon surface of a gate electrode. Therefore, the conventional problem that a crack occurrence from a connection region between an emitter electrode and a second gate electrode can be solved and a gate short circuit and a withstand-voltage short circuit can be effectively suppressed from being generated.

In this first aspect of the present invention, the semiconductor device may further include a carrier stored region of the first conductivity type formed between the base region and the semiconductor substrate, wherein the carrier stored region has an impurity concentration higher than that of the semiconductor substrate.

Also, in this first aspect, the trenches may be formed in parallel to each other in stripes. In this configuration, the semiconductor device may include a gate wiring electrode which orthogonally crosses terminal portions of the first trench and the second trench, wherein the gate wiring electrode is connected to only the first gate electrode, and the second gate electrode is partially connected to the emitter electrode only in a region near the gate wiring electrode.

Also, in this first aspect, an insulating interlayer may be formed between the emitter electrode and the gate electrodes, wherein the insulating interlayer has a pattern configuration such that the second gate electrode is partially connected to the emitter electrode.

According to a second aspect of the present invention, the portions of the insulating interlayer disposed on the second gate electrode may be separated from each other in a square form.

With this arrangement of the second aspect, there can be attained an effect that, when in a turn-off state of a CSTBT, a hole path can be secured so that the holes stored in the $n^-$-type semiconductor layer move to the emitter electrode through the p-type base region.

According to a third aspect of the present invention, a ratio of a connection area S2 between the second gate electrode and the emitter electrode to an entire exposed surface area S1 of the second gate electrode buried in the second trench is given by S2/S1<70%.

With this arrangement of the third aspect, the insulating interlayer arranged between the emitter electrode and the second gate electrode can moderate a stress caused by ultrasonic connection acting on the silicon gate electrode, and can effectively prevent a crack and a gate short circuit from being generated.

According to a fourth aspect of the present invention, an aluminum wire may be connected to the emitter electrode by ultrasonic connection, and the emitter electrode and the second gate electrode are connected to each other in a region except for a region immediately below the connection between the emitter electrode and the aluminum wire.

With this arrangement of the fourth aspect, the second gate connection portion located immediately below an emitter electrode portion connected to the aluminum wire by ultrasonic connection has an upper surface covered with an insulating interlayer 9b. For this reason, a crack and a gate short circuit can be suppressed to the minimum from being generated.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An insulated gate semiconductor device comprising:

a semiconductor substrate of a first conductivity type;

a collector region of a second conductivity type formed on a lower major surface of said semiconductor substrate;

a collector electrode connected to said collector region;

a base region of the second conductivity type selectively formed on an upper major surface of said semiconductor substrate;

an emitter region of the first conductivity type selectively formed in said base region;

a plurality of trenches including first, second, and third trenches selectively formed in said base region, each of said trenches having a depth passing through said base region and reaching the semiconductor substrate;

first, second, and third gate electrodes buried in said first, second, and third trenches through insulating films, respectively; and an emitter electrode to which said base region, said emitter region, and said second gaze electrode are commonly connected, wherein said third gate electrode is connected to only said first gate electrode, and said emitter electrode is partially connected to said second gate electrode and a part of the base region bordering with the second trench.

2. The semiconductor device according to claim 1, further comprising a carrier stored region of the first conductivity type formed between said base region and said semiconductor substrate, said carrier stored region having an impunity concentration higher than that of said semiconductor substrate.

3. The semiconductor device according to claim 1, wherein said plurality of trenches are formed in parallel to each other in stripes.

4. The semiconductor device according to claim 3, comprising a gate wiring electrode which orthogonally crosses terminal portions of said first trench and said second trench, wherein said gate wiring electrode is connected to only said first gate electrode, and said second gate electrode is partially connected to said emitter electrode only in a region near said gate wiring electrode.

5. The semiconductor device according to claim 1, further comprising an insulating interlayer which is formed between said emitter electrode and said gate electrodes, said insulting interlayer having a patent configuration such that said second gate electrode is partially connected to said emitter electrode.

6. The semiconductor device according to claim 5, wherein portions of said insulating interlayer disposed on said second gate electrode are separated from each other in a square form.

7. The semiconductor device according to claim 1, wherein a ratio of a connection area S2 between said second gate electrode and said emitter electrode to an entire exposed surface area S1 of said second gate electrode formed in said second trench is given by,

S2/S1<70%.

8. The semiconductor device according to claim 1, wherein emitter wire is connected to said emitter electrode by ultrasonic connection, and said mister electrode and said second gate electrode are connected to each other in a region except for a region immediately below the connection between the emitter electrode and the aluminum wire.

* * * * *